(12) United States Patent
Beyke

(10) Patent No.: US 6,320,920 B1
(45) Date of Patent: Nov. 20, 2001

(54) PHASE COHERENCE FILTER

(76) Inventor: Gregory Lee Beyke, 1100 Laurel Crest Way, Marietta, GA (US) 30064-3978

( * ) Notice: Subject to any disclaimer, the term of this patent is extended or adjusted under 35 U.S.C. 154(b) by 0 days.

(21) Appl. No.: 09/168,492

(22) Filed: Oct. 8, 1998

(51) Int. Cl.$^7$ ........................................ H04L 1/02
(52) U.S. Cl. .......................................... 375/350; 375/348
(58) Field of Search .................... 375/346, 348, 375/350; 370/491, 342, 335; 708/670, 675

(56) References Cited

U.S. PATENT DOCUMENTS

| | | | |
|---|---|---|---|
| 5,130,943 | 7/1992 | Gazsi et al. | 364/724.19 |
| 5,166,749 | 11/1992 | Curbelo et al. | 356/346 |
| 5,301,135 | 4/1994 | Principe et al. | 364/724.17 |
| 5,331,587 | 7/1994 | Abel et al. | 364/825 |
| 5,383,145 | 1/1995 | Sakiyama et al. | 364/724.16 |
| 5,442,582 | 8/1995 | Lange et al. | 364/825 |
| 5,487,089 | 1/1996 | Misaizu et al. | 375/296 |
| 5,548,209 | 8/1996 | Lusignan et al. | 324/142 |
| 5,596,600 | * 1/1997 | Dimos et al. | 375/206 |
| 5,598,159 | 1/1997 | Hein | 341/143 |
| 5,623,928 | 4/1997 | Wright et al. | 128/661.01 |
| 5,667,373 | 9/1997 | Wright et al. | 128/660.07 |
| 5,668,746 | 9/1997 | Iwaki et al. | 364/724.14 |
| 5,668,895 | 9/1997 | Yamazaki et al. | 382/260 |
| 5,706,085 | 1/1998 | Blossey et al. | 356/357 |
| 6,014,373 | * 1/2000 | Schilling et al. | 370/342 |
| 6,192,238 | * 2/2001 | Piirainen | 455/422 |

OTHER PUBLICATIONS

World Wide Web Page "The Phase–Locked Loop," http://yake.ecn.purdue.edu/~roos/modem/pll/pll.html, Oct. 8, 1997.

\* cited by examiner

*Primary Examiner*—Chi Pham
*Assistant Examiner*—Dung X. Nguyen
(74) *Attorney, Agent, or Firm*—Troutman Sanders LLP; R. Stevan Coursey

(57) ABSTRACT

An apparatus and method for improving the signal-to-noise ratio of a composite input signal having a desired signal and one or more undesired, noise signals mixed therewith. In a preferred embodiment, the present invention comprises a phase coherence filter which improves the signal-to-noise ratio of a composite input signal having a periodic signal and an aperiodic signal by interfering a sample of the composite input signal taken at a current time during a current cycle of the periodic signal with one or more previous samples of the composite input signal taken at one or more respective previous times during one or more respective previous cycles of the periodic signal, where the periodic signal at the respective previous time(s) of the respective previous cycle (s) is substantially in-phase with the periodic signal at the current time during the current cycle. The phase coherence filter includes a memory, an adder, and an attenuator. The memory connects to a source of digital data samples of the composite input signal and stores digital data samples of the composite input signal taken during one or more previous cycles of the periodic signal. The adder receives digital data samples from the memory which are substantially in-phase with a current digital data sample. The adder constructively interferes the periodic portion of the digital data samples and destructively interferes the aperiodic portion of the digital data samples to generate an intermediate resultant. The attenuator receives the intermediate resultant and adjusts its amplitude to at least substantially match the amplitude of the composite input signal, thereby creating an output data sample. By processing successive digital data samples, the phase coherence filter produces an output signal having an improved signal-to-noise ratio when compared to the composite input signal due to the destructive interference and attenuation of the aperiodic signal.

19 Claims, 8 Drawing Sheets

PHASE COHERENCE FILTER

FIELD OF THE INVENTION

This invention relates generally to devices for increasing the signal-to-noise ratio of signals, and in its preferred embodiments, to devices for improving the signal-to-noise ratio of composite signals including periodic and aperiodic signals.

BACKGROUND OF THE INVENTION

A fundamental problem in the field of signal processing is the removal of unwanted "noise" signals from combination with a desired, or base, signal. The unwanted noise signals often arise from one or more sources and become mixed with the desired signal, due to one or more different reasons, to define a composite signal. Often, the desired signal has a periodic waveform with a particular characteristic frequency (i.e., such desired signals being referred to herein as "periodic signals"), while the unwanted "noise" signals have aperiodic waveforms (i.e., such unwanted "noise" signals having aperiodic waveforms being referred to herein as "aperiodic signals"), periodic waveforms with characteristic frequencies different than the characteristic frequency of the desired signal, or waveforms which are out of phase with the desired signal. The presence of such noise signals with periodic signals that are communicated from one site to another frequently requires the use of increased transmitter power or larger receiving antennas to ensure accurate communication of the periodic signals.

Over the years, engineers working in the field of signal processing have grappled with the problem of removing unwanted noise signals from a composite signal in order to increase the signal-to-noise ratio ("SNR") of a composite signal and have developed a number of techniques and systems for removing the unwanted noise signals. One such technique involves the use of systems which employ frequency filters that receive an incoming signal comprised of a desired signal and one or more noise signals (i.e., a composite input signal) and produce an outgoing signal which includes the desired signal and no noise signals or a reduced number of noise signals. In such cases, the desired signal has a characteristic frequency, while the unwanted noise signals have characteristic frequencies different than that of the desired signal. Frequency filters take advantage of the difference in frequencies by enabling passage of signals having frequencies above or below a threshold filtering frequency and by blocking passage of signals having frequencies conversely above or below the threshold filtering frequency.

While frequency filters function quite well in practice, they suffer from several disadvantages. First, in many cases, at least two stages of frequency filters must be employed to remove unwanted noise signals from a composite signal, thereby increasing the cost of a device which employs the frequency filters. The necessity of employing two stages of frequency filters arises because a first stage frequency filter is necessary to remove unwanted noise signals having frequencies below a threshold filtering frequency (i.e., the frequency of the desired signal) and a second stage frequency filter is necessary to remove unwanted noise signals having frequencies above a threshold filtering frequency. Second, in some cases, the desired signal and a noise signal have substantially the same characteristic frequency and, as a result, frequency filters cannot block passage of the noise signal without also blocking passage of the desired signal.

Another fundamental problem in the field of signal processing is the effects of time quantization that arise when digital sampling techniques are employed to minimize the transmission bandwidth required for communication of an analog signal. Such digital sampling techniques typically enable very accurate reproduction of the amplitude of the analog signal, but less than accurate reproduction of the waveform of the analog signal unless the analog signal is sampled many times per cycle. Digital transmission of the analog signal is, therefore, subject to a trade-off between the number of samples taken per cycle of the analog signal and the accuracy of the reproduction of the signal's waveform. The limit of sample economy is expressed by Nyquist's Theorem which states that a waveform cannot be appropriately represented and reproduced unless the waveform is sampled at least twice per cycle.

While in many applications the effects of time quantization are of little importance, the effects are very important in signal processing systems which reproduce human speech and music. Such systems must accurately reproduce speech and music because the human ear requires high-quality reproduction of analog signal waveforms. Unfortunately, because the accuracy of reproduction is limited by Nyquist's Theorem, a relatively large number of samples is required to produce the necessary accuracy.

Therefore, there is a need in the industry for a phase coherence filter which improves the signal-to-noise ratio of a composite signal, which enables accurate reproduction of a waveform using a lower sampling rate than that called for by Nyquist's Theorem, and which addresses these and other related, and unrelated, problems.

SUMMARY OF THE INVENTION

Briefly described, the present invention comprises an apparatus and method for improving the signal-to-noise ratio of a composite input signal having a desired signal and one or more undesired, noise signals mixed therewith. More specifically, the present invention includes a phase coherence filter which improves the signal-to-noise ratio of a composite input signal having a desired, periodic signal and an undesired, aperiodic signal by interfering a sample of the composite input signal taken at a current time during a current cycle of the periodic signal with one or more previous samples of the composite input signal taken at one or more respective previous times during one or more respective previous cycles of the periodic signal, where the periodic signal at the respective previous time(s) of the respective previous cycle(s) is in-phase with the periodic signal at the current time during the current cycle. During interference of the composite input signal, the periodic signal at the current time constructively interferes with the periodic signal at the respective previous, in-phase time(s) and the aperiodic signal at the current time, generally, destructively interferes (i.e., when a sufficient number of previous samples is employed) with the aperiodic signal at the respective previous time(s). A composite intermediate signal (i.e., having a periodic signal and, perhaps, an aperiodic signal) is produced by repeating the above-described interference process at different times during a current cycle of the periodic signal. Because the constructive interference of the periodic signal amplifies the periodic signal by an amount dependent upon the number of previous samples of the composite input signal which are employed in the interference process, the composite intermediate signal is attenuated to adjust its amplitude (i.e., to equal, or substantially correspond to, the amplitude of the composite input signal) and, hence, to produce a composite output signal. By destructively interfering the aperiodic signal present in the composite input signal and by attenuating any aperiodic signal present in the composite intermediate signal, the signal level of the aperiodic signal relative to the signal level of the periodic signal of the composite output signal is reduced substantially, thereby resulting in a composite output signal having an improved (or increased) signal-to-noise ratio as compared to the signal-to-noise ratio of the composite input signal.

In accordance with a first preferred embodiment of the present invention and in its most simple form, the phase coherence filter connects between a source of a digitized composite input signal and a destination of the digitized composite input signal and comprises a memory which connects to the source and receives a stream of digital, data samples representative of the composite input signal. Each data sample (also referred to herein as a "digital data sample" or as a "sample") has an amplitude reflecting the amplitude of the composite input signal, and includes a periodic portion representative of the periodic signal (i.e., that is a part of the composite input signal) and, most likely, an aperiodic portion representative of the aperiodic signal (i.e., that is a part of the composite input signal). Preferably, the data samples are taken from the composite input signal in a manner that provides data samples to the phase coherence filter for successive cycles of the periodic signal at substantially the same times relative to the start of each successive cycle of the periodic signal. The memory is organized as a plurality of memory cells each capable of storing a data sample of the composite input signal. Preferably, the memory is further organized so as to enable the shifting of each previously received data sample into a successive memory cell upon receipt of a new, current data sample (i.e., which is stored in the memory's first memory cell). The phase coherence filter further comprises an adder, having multiple input ports and a single output port, and an attenuator having a single input port and a single output port. The adder's input ports connect to a subset of the memory cells that respectively store, as described herein, one data sample out of the total number of data samples taken during a cycle of the periodic signal. The adder's output port connects to the attenuator's input port. The attenuator's output port connects to the destination of the digitized composite input signal.

According to a method of the first preferred embodiment, the phase coherence filter receives a data sample of the composite input signal and, prior to storing the new data sample in the memory's first memory cell, shifts the data samples currently stored in each memory cell to the next successive memory cell in a manner the preserves the data samples. After storing the new data sample, the adder receives the new data sample and at least one other data sample from the subset of memory cells to which the adder connects. The connected memory cells, after shifting, hold data samples which were previously taken from the composite input signal during previous cycles of the periodic cycle at times relative to the start of the respective previous cycles which are substantially similar to the time at which the new data sample has been taken relative to the start of the current cycle of the periodic signal (i.e., the connected memory cells hold data samples which are in-phase with the new data sample). The adder combines the received data samples to constructively interfere the periodic signal portion of the data samples and to destructively interfere the aperiodic signal portion, if any, of the data samples. Upon completion of the interference of the data samples, the adder produces an intermediate resultant, at its output port, representing the constructive and destructive interference of the data samples of the composite input signal. Because the constructive interference of the periodic signal portions of the data samples generally causes the intermediate resultant to have an amplitude at least substantially equivalent to the sum of the amplitudes of the data samples, the attenuator reduces the amplitude of the intermediate resultant to at least substantially match the amplitude of the periodic portion of the new data sample and, hence, to produce an output data sample at the output port of the attenuator. By similarly processing a stream of new data samples, the phase coherence filter generates a stream of intermediate resultants which define an intermediate signal and generates a stream of output data samples which define an output signal.

In accordance with a second preferred embodiment of the present invention, a substantially similar phase coherence filter further comprises a selector which connects between the memory and the adder. The selector, in operation, chooses appropriate data samples from the memory and communicates them to the adder for interference processing. According to other preferred embodiments of the present invention, substantially similar phase coherence filters further comprise additional adders, inverters, and multiple stages of phase coherence filters like those of the first or second preferred embodiments.

The present invention enables the improvement of the signal-to-noise ratio of a composite input signal having periodic and aperiodic signals regardless of the frequencies of the respective signals, but is employable with conventional frequency filters to further enhance improvement of the signal-to-noise ratio. The phase coherence filter of the present invention is especially proficient at removing, or reducing the effective presence of, noise signals when the signal-to-noise ratio of a composite input signal is very poor (i.e., less than one) and can improve the signal-to-noise ratio by a factor of 100 (20 dB). The phase coherence filter of the present invention is also equally effective with all periodic signals including, for example and not limitation, sinusoids, square waves, and triangular waves. Further, the phase coherence filter is effective with most modulated signals (i.e., provided that the carrier frequency is much greater than the bandwidth of the modulated signals), thereby enabling its use, for example, with AM radio signals, FM radio signals, most television signals, and cellular telephone signals. By enabling a substantial improvement in the signal-to-noise ratio of a composite input signal, the present invention allows, for instance, the use of less powerful transmitters and smaller receiving antennas for the communication of periodic signals with all of the inherent benefits thereof.

Additionally, the present invention allows the receipt of a noisy composite input signal, the extraction of a first sinusoidal signal from the composite input signal, and the removal of the first sinusoidal signal by anti-phase cancellation to extract a weaker second sinusoidal signal. In extracting and outputting the second sinusoidal signal, the phase coherence filter of the present invention produces a signal which is likely unproduceable through the use of conventional frequency filters or phase-locked loops.

The present invention further enables the generation of an accurate digital representation of an analog waveform using a lower sampling rate than that called for by Nyquist's Theorem. By enabling the generation of such an accurate digital representation, the phase coherence filter of the present invention allows the accurate reproduction of analog signals, such as human speech and music, in which the highest frequencies are maintained for many cycles.

DETAILED DESCRIPTION OF THE PREFERRED EMBODIMENTS

Figure 1:
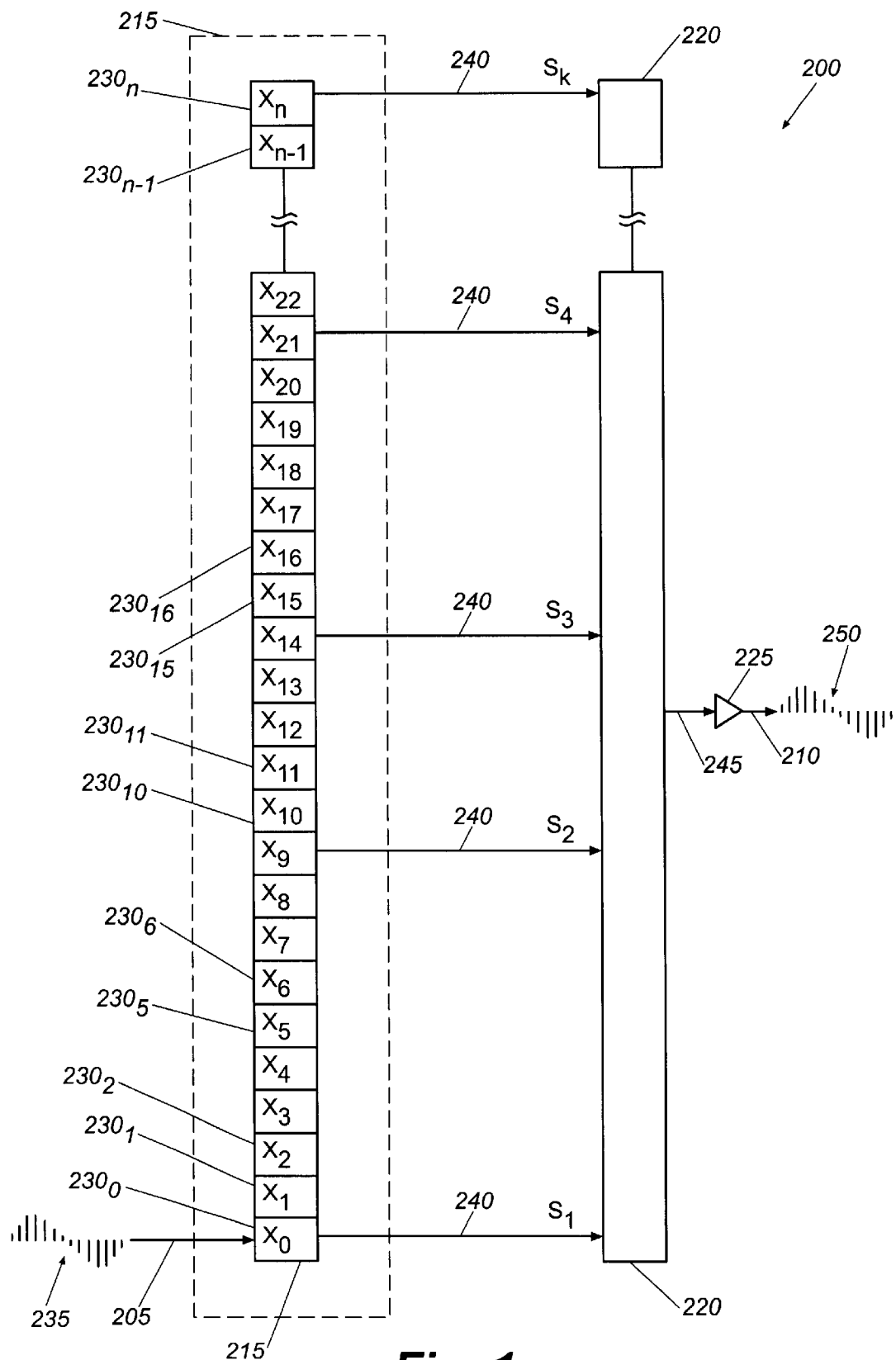
FIG. 1 displays a block diagram representation of a filter in accordance with a first preferred embodiment of the present invention.

Referring now to the drawings, in which like numerals represent like components throughout the several views, a phase coherence filter 200 for improving the signal-to-noise ratio of a composite input signal in accordance with the first preferred embodiment of the present invention, is shown in block diagram form in FIG. 1. The filter 200 has an input data line 205 and an output data line 210, and comprises a memory 215, an adder 220 and an attenuator 225. The memory 215 includes a plurality of memory cells 230 which each store data representative of one digital data sample, $X_i$, (also referred to herein as a "data sample" or "sample") of a digital, composite input signal 235. The number of memory cells 230 is selected so that samples representative of a plurality of cycles of composite input signal 235 are stored in memory 215 simultaneously. An exemplary memory 215, acceptable in accordance with the first preferred embodiment of the present invention, is a shift register of size n x z, where n is the total number of memory cells 230 and z is the number of bits of data stored for each sample $X_i$. In an alternate embodiment of the present invention, an acceptable memory 215 is a portion of a RAM memory which is controlled by dedicated control logic.

Memory 215 connects to the inputs of adder 220 via hard-wired data lines 240 which connect a specifically-selected subset of memory cells 230 to the adder inputs. The memory cells 230 of the subset are selected so that data lines 240 connect to memory cells 230 which store integer multiples of a tunable period, $P_t$ (described below) having an integer value. In order to ensure that the subset of memory cells 230 contains substantially in-phase data samples for use by the adder 220 as described below, (1) the frequency of the periodic signal must be known in advance and used to identify the appropriate memory cells 230 for the subset of memory cells 230, or (2) the sample rate of the analog-to-digital converter (described below) is variable and controlled by the phase coherence filter 200, or (3) the memory 215 update rate is not equal to the sample rate.

The output of adder 220 connects to the input of attenuator 225 through data line 245. The output of attenuator 225, present on output data line 210, is the output of phase coherence filter 200 which includes data representing samples of digital output signal 250.

Figure 2A:
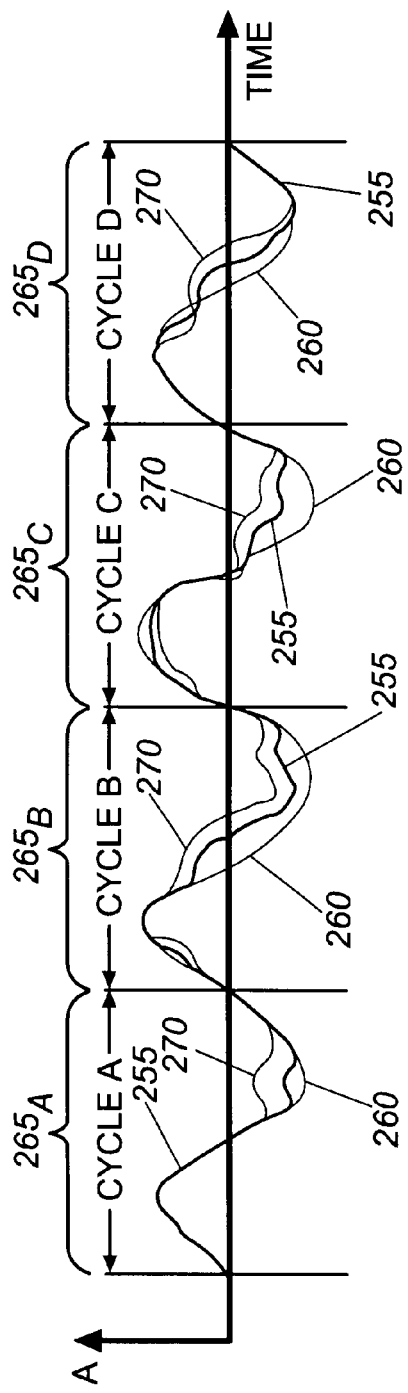
FIG. 2A displays a graphical representation of a periodic analog input signal in the amplitude-time domain.
Figure 2B:
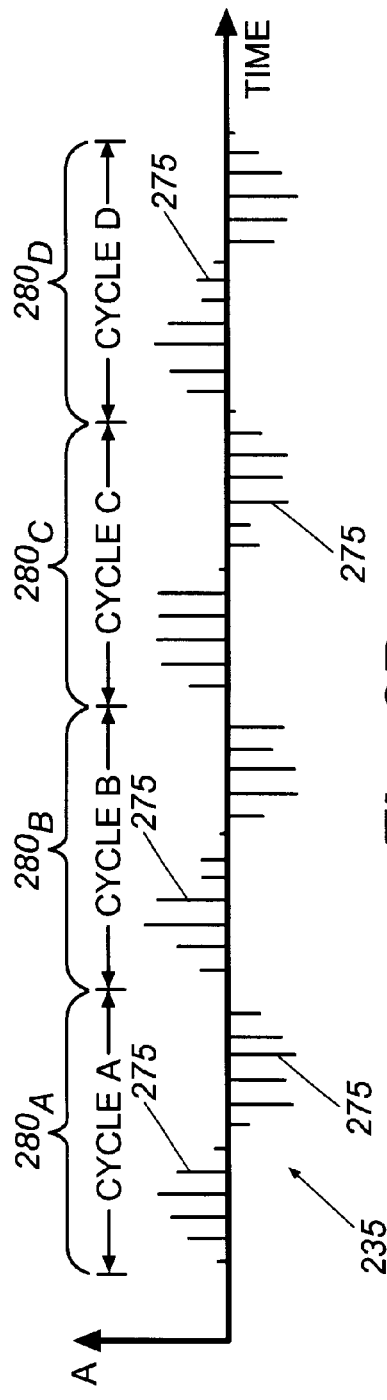
FIG. 2B displays a graphical representation of a digitized input signal in the amplitude-time domain corresponding to the periodic analog input signal of FIG. 2A.

In accordance with a method of the first preferred embodiment of the present invention, an analog-to-digital converter (not shown) digitizes an analog composite input signal 255, including a periodic signal 260 having a plurality of cycles 265 (see FIG. 2A in which alpha subscripts indicate individual cycles) and an aperiodic signal 270, to produce digital composite input signal 235 comprised of a plurality of samples 275 taken over time which define a plurality of cycles 280 (see FIG. 2B in which alpha subscripts indicate individual cycles) corresponding substantially to the plurality of cycles 265 of the periodic signal 260 of the composite input signal 255. Note that while FIG. 2A shows a composite input signal 255 having a signal-to-noise ratio greater than one for purposes of illustration, the present invention is particularly well-suited to receive and clean-up composite input signals 255 having signal-to-noise ratios less than one. The number of samples taken during each cycle of periodic signal 260 is known as the tunable period, $P_t$. Preferably, the tunable period is equal to n/(k−1), where n represents the total number of memory cells 230 and k represents the number of memory cells 230 connected to the adder 220.

The phase coherence filter 200 sequentially receives the samples 275 of composite input signal 235 (i.e., actually data representative of the amplitudes of composite input signal 235 and also indicated herein by $X_i$) and loads the samples 275 into memory 215 for storage. As memory 215 receives each digital sample $X_i$, the contents of each memory cell 230 are shifted into the next successive memory cell 230 (i.e., indicated in FIG. 1 by the next higher numeric subscript) and the received digital sample $X_i$ is directed to a first memory cell $230_0$ in memory 215. For example, upon receipt of a new sample, the contents of first memory cell $230_0$ are shifted into second memory cell $230_1$, the contents of second memory cell $230_1$ are shifted into third memory cell $230_2$, the contents of next-to-last memory cell $230_{n-1}$ are shifted into last memory cell $230_n$, and the new sample is stored in first memory cell $230_0$. The shifting is done in such a manner that the contents of each memory cell 230 are safely preserved before the contents of that memory cell 230 are over-written with new data.

Figure 3:
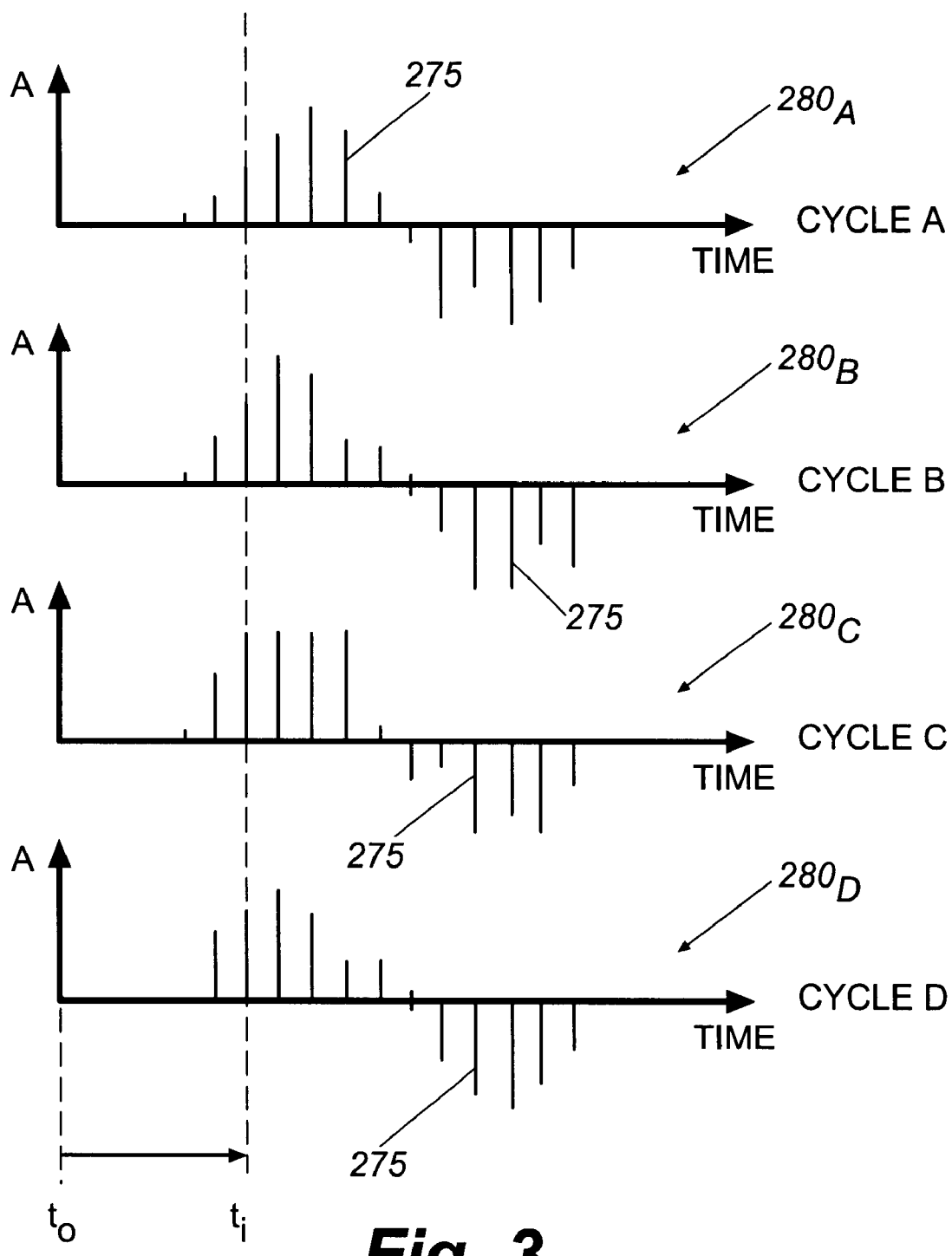
FIG. 3 displays graphical representations, in the amplitude-time domain, of successive cycles of the digitized input signal of FIG. 2B positioned above one another to illustrate the alignment of digital samples.

Once the contents of the memory cells 215 are shifted and the received digital sample $X_i$ is successfully stored in first memory cell $230_0$ of memory 215, the contents of the subset of memory cells 230 are output to adder 220 via data lines 240. As noted above, the subset of memory cells 230 stores digital samples 275 which are taken at integer multiples of a tunable period, $P_t$, having an integer value and which are substantially in-phase with one another. To illustrate, FIG. 3 displays a set of four graphs, in the amplitude-time domain, that align the samples 275 taken and concurrently stored in memory 215 from successive cycles 280 of the digital composite input signal 235 of FIG. 2B (i.e., cycle $280_A$, cycle $280_B$, cycle $280_C$ and cycle $280_D$). The subset of digital samples 275 communicated to adder 220 at a given time includes a sample from each of cycle $280_A$, cycle $280_B$, cycle $280_C$, and cycle $280_D$ which is closest to the same phase angle (or, closest to the same position in time relative to the starting time, $t_0$, of each cycle 280) of each cycle 280 as indicated by the dashed line aligned at the sample time, $t_i$, of each cycle's time axis.

Figure 4A:
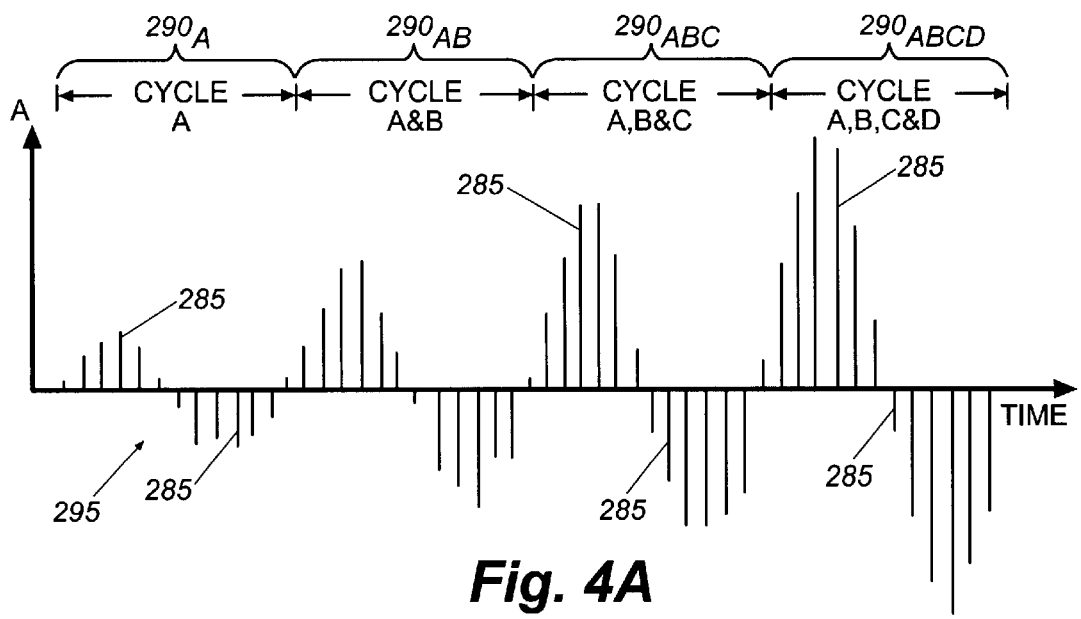
FIG. 4A displays a graphical representation of an intermediate digital signal, in the amplitude-time domain, illustrating addition of the aligned digital samples of FIG. 3.
Figure 4B:
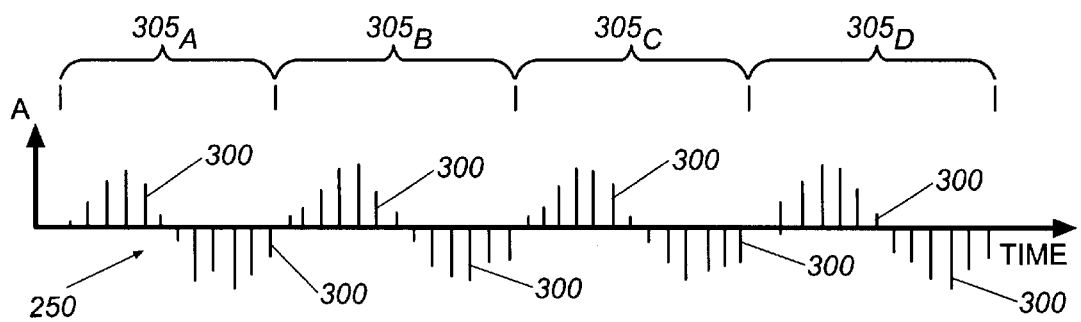
FIG. 4B displays a graphical representation of a digital output signal, in the amplitude-time domain, illustrating averaging of the digital samples of the digital signal of FIG. 4A.

Upon receipt of the samples 275 from memory 215 via data lines 240, adder 220 combines (and interferes) the samples 275 taken at a phase angle of the digital composite input signal 235 (i.e., at a position in time relative to the start of each cycle 280 of the composite input signal 235) to produce an intermediate resultant 285. Note that, as seen in the amplitude-time domain of FIG. 4A, during a transient period shortly after the signal processing starts, only samples 275 from a first cycle $280_A$ of composite input signal 235 are available for direction from memory 215 to adder 220 and adder 220, therefore, produces a plurality of intermediate resultants 285 having amplitudes at least substantially matching the amplitudes of the samples 275 of the first cycle $280_A$. The intermediate resultants 285, taken together, define a first cycle $290_A$ of an intermediate digital signal 295 present on data line 245. As time increases and signal processing continues, samples from the first and second cycles $280_A$, $280_B$ of digital composite input signal 235 are available for selection from memory 215 and, hence, adder 220 produces a plurality of intermediate resultants 285 having amplitudes matching the sum of the amplitudes of the samples 275 of the first and second cycles $280_A$, $280_B$ and which define a second cycle $290_{AB}$ of the digital intermediate signal 295 present on data line 245. Continuation of signal processing over time similarly produces new pluralities of intermediate resultants 285 having respective amplitudes which match the sum of the amplitudes of the samples 275 taken from an increased number of cycles 280 of digital composite input signal 235 (i.e., until steady-state operation is achieved and the number of cycles 280 from which samples are taken stabilizes at a constant number of cycles 280) and which when taken together, the respective new pluralities of intermediate resultants 285 define new cycles 290 of the intermediate digital signal 295 present on data line 245.

In order to make the amplitudes of the intermediate resultants 285 present in the intermediate signal 295 correspond at least substantially to those of the periodic signal of composite input signal 235, the attenuator 225 divides the amplitudes of the intermediate resultants 285 present in the intermediate signal 295 by the total number of samples, k, present in each cycle 280 of composite input signal 235. Continual operation of the attenuator 225, in concert with the continual operation of the other components of the phase coherence filter 200, produces the filter's output signal 250 including samples 300 which have amplitudes at least substantially matching respective amplitudes of the periodic component of samples 275 of the composite input signal 235. The filter's output signal 250 also has a plurality of cycles 305 with each successive cycle 305 corresponding to a respective cycles of intermediate signal 295, digital composite input signal 235, and analog composite input signal 255 (i.e., cycle $305_A$ corresponds to respective cycles $290_A$, $280_A$, and $265_A$; cycle $305_B$ corresponds to respective cycles $290_{AB}$, $280_B$, and $265_B$; cycle $305_C$ corresponds to respective cycles $290_{ABC}$, $280_C$, and $265_C$; and, cycle $305_D$ corresponds to respective cycles $290_{ABCD}$, $280_D$, and $265_D$).

Figure 4C:
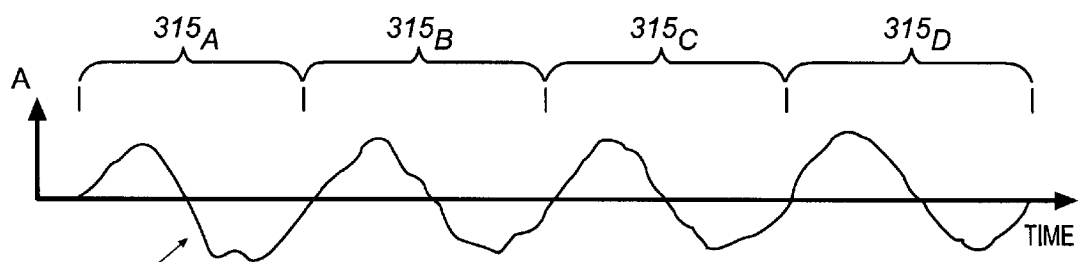
FIG. 4C displays a graphical representation of an analog output signal, in the amplitude-time domain, corresponding to the digital output signal of FIG. 4B.

The filter's digital output signal 250 includes less aperiodic noise than is present in the analog composite input signal 255 (i.e., and, hence, has an improved signal-to-noise ratio) because the aperiodic signal 270 of signal 255 destructively interferes in adder 220 and is reduced in amplitude by attenuator 225. It should be noted that the reduction of aperiodic noise present in the filter's output signal 250 increases when the number of samples 275 that are combined (i.e., interfered) and averaged with the current sample is increased. The improvement in the reduction of aperiodic noise is visible in FIG. 4C by comparing the nearly smooth waveform of cycle $315_D$ of an analog output signal 310 (i.e., created from digital output signal 250 by processing signal 250 through an digital-to-analog converter) to the waveforms of earlier cycles $315_A$, $315_B$, and $315_C$. The filter's digital output signal 250 has a signal-to-noise ratio that is improved over the digital composite input signal 235 by a factor of k.

Figure 5:
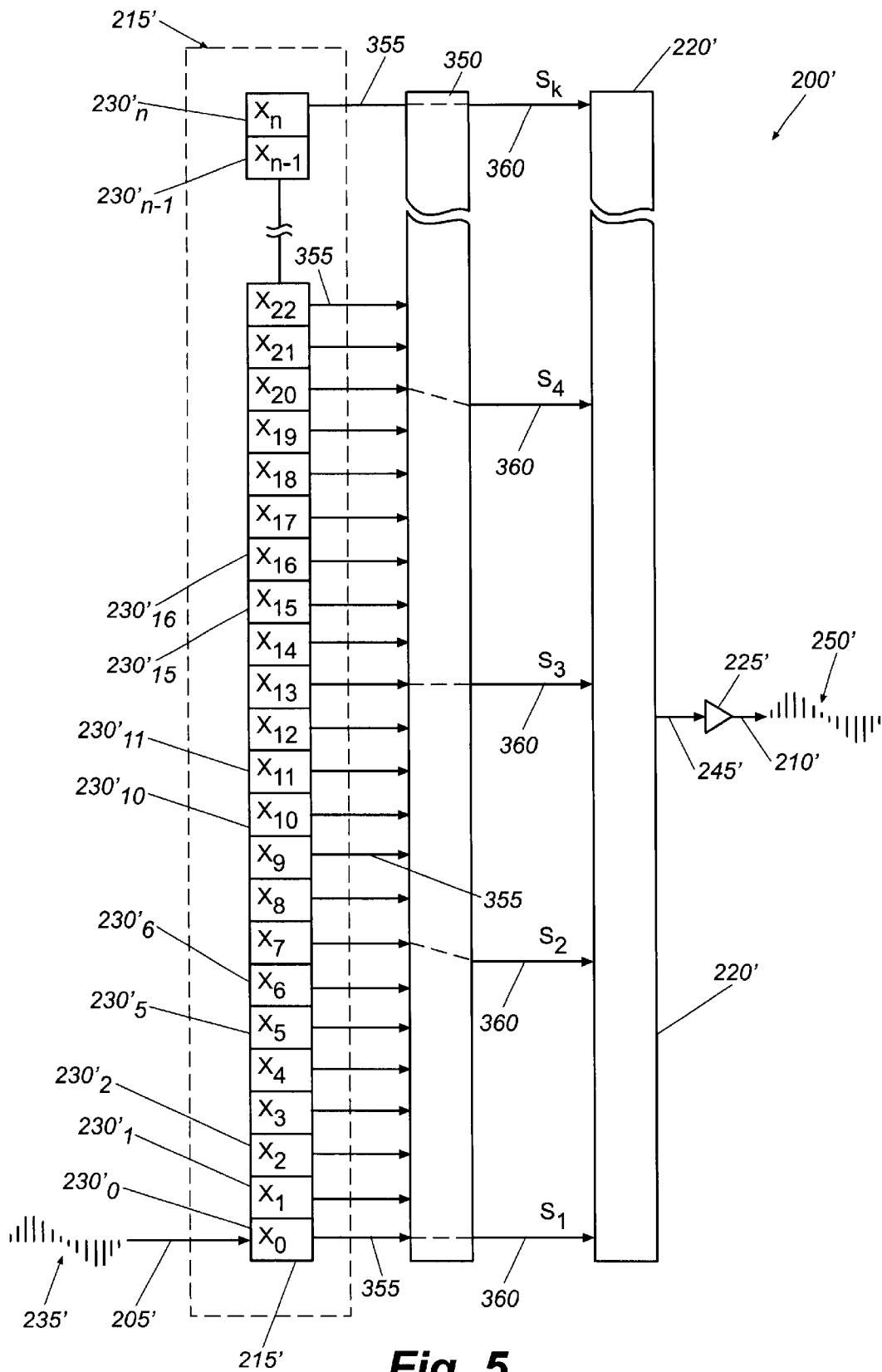
FIG. 5 displays a block diagram representation of a phase coherence filter in accordance with a second preferred embodiment of the present invention.

In accordance with an apparatus of a second preferred embodiment of the present invention, a phase coherence filter 200', substantially similar to phase coherence filter 200 of the first preferred embodiment, additionally comprises a selector 350 interposed between memory 215'and adder 220' as seen schematically in FIG. 5. The selector 350 connects to memory 215' via data lines 355 and to adder 220' via data lines 360. The selector 350 selects desired samples of composite input signal 235' from memory 215' and directs them to adder 220' for combination. An example of a selector 350, acceptable in accordance with the second preferred embodiment of the present invention, is a selector 350 comprising logic dedicated to select appropriate samples from memory 215' as described below. Another example of a selector 350, acceptable in accordance with an alternate embodiment of the present invention, is a general purpose central processing unit (CPU) which executes software that causes the selection of appropriate samples from memory 215'.

According to a method of the second preferred embodiment of the present invention, the phase coherence filter 200' operates in a substantially similar manner to the phase coherence filter 200 of the first preferred embodiment. However, according to the method of the second preferred embodiment, the selector 350 identifies the memory cells 230' of memory 215' from which samples are to be selected and directs the selected samples to adder 220' via data lines 360 once a received digital sample $X_i$ is successfully stored in memory 215'. The number of memory cells 230' from which samples are selected, k, is related to the total number of memory cells 230', n, according to the following equation:

$$k = \text{ROUND}\,[(n/P_t)+1]$$

The selected samples, $S_i$, directed to adder 220' by data lines 360 are those samples from previous cycles which are closest to being in the same phase as the present input sample. In other words, the samples of data $S_i$ which are selected are the ones in those memory cells 230' which lie closest to the multiples of the tunable period, $P_t$, as identified according to the following equation:

$$S = X_{ROUND[(Pt\,\cdot\,(i-1)]}$$

For example, if a typical value of 6.55 is selected for the tunable period, $P_t$, then three of the samples, $S_i$, of digital composite input signal 235' selected from memory 215 and sent to adder 220' are:

$$S_1 = X_{ROUND[6.55\,\cdot\,(1-1)]} = X_{ROUND[0]} = X_0$$

$$S_2 = X_{ROUND[6.55\,\cdot\,(2-1)]} = X_{ROUND[6.55]} = X_7$$

$$S_3 = X_{ROUND[6.55\,\cdot\,(3-1)]} = X_{ROUND[13.10]} = X_{13}$$

Upon receipt of the selected samples on data lines 360, the adder 220' combines (and interferes) the selected samples taken at the desired phase angle of the digital composite input signal 235' to produce an intermediate resultant 285' in a method substantially similar to that of the method of the first preferred embodiment. Similarly, attenuator 225' produces an output signal 250' which includes samples 300' having amplitudes at least substantially matching respective amplitudes of the periodic component of samples 275' of the composite input signal 235'.

In an alternate embodiment of the present invention, the phase coherence filter 200' of the second preferred embodiment further comprises a tuner which connects to selector 350. The tuner determines the value of the tunable period, $P_t$, and supplies that value to the selector 350 to enable selection of the appropriate samples from memory cells 230'. An exemplary tuner, acceptable in accordance with the alternate embodiment, is a steering circuit which compares the current output of the phase coherence filter 200' to the output of the phase coherence filter 200' resulting from higher or lower values of the tunable period.

Figure 6:
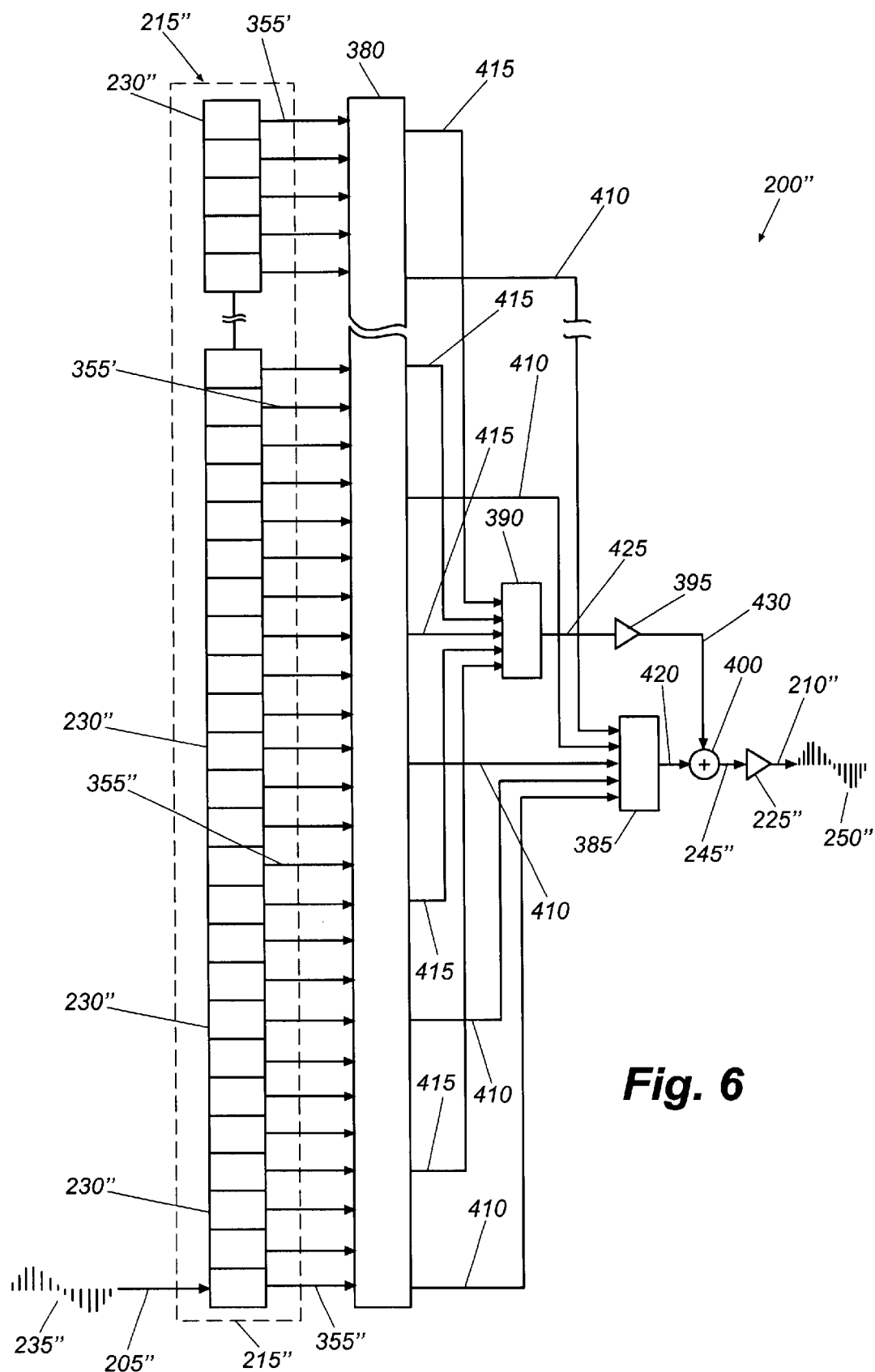
FIG. 6 displays a block diagram representation of a phase coherence filter in accordance with a third preferred embodiment of the present invention.

FIG. 6 displays a block diagram representation of a phase coherence filter 200", in accordance with an apparatus of a third preferred embodiment of the present invention, which is similar to the phase coherence filters 200, 200' of the first and second preferred embodiments. The phase coherence filter 200" comprises a memory 215", a modified selector 380, a first adder 385, a second adder 390, an inverter 395, a third adder 400, and an attenuator 225". Memory 215" stores a plurality of samples received on data line 205" in memory cells 230" as described above with respect to the first and second preferred embodiments. Memory 215" connects, via data lines 355", to modified selector 380 which selects a first plurality of samples from memory 215" and directs the samples of the first plurality of samples to first adder 385 via data lines 410. The modified selector 380 also selects a second plurality of samples from memory 215" and directs the samples of the second plurality of samples to the second adder 390 through data lines 415. The output of the first adder 385 connects, via data line 420, to a first input of the third adder 400. The output of second adder 390 connects, via data line 425, to the input of inverter 395. Data line 430 connects the output of inverter 395 to a second input of third adder 400. The output of the third adder 400 connects to attenuator 225" through data line 245". The output of attenuator 225", on data line 210", is the output of the phase coherence filter 200".

According to a method of the third preferred embodiment of the present invention which is somewhat similar to the methods of the first and second preferred embodiments, the phase coherence filter 200" sequentially receives the samples of digital composite input signal 235" having cycles corresponding to those of an included periodic signal in which the waveform of the first half of each cycle is identical to the waveform of the second half of each cycle when the second half of each cycle is inverted. Each sample, $X_i$, is initially loaded into first memory cell 230$_0$" of memory 215" in a manner similar to that described above. Next, modified selector 380 selects a first plurality of samples from a first plurality of memory cells 230" and outputs the samples to first adder 385. The number of memory cells 230", k, chosen for the first plurality of samples is related to the total number of memory cells, n, according to the following equation in which $P_t$ represents the tunable period:

$$k=\text{ROUND}[(n/P_t)+1]$$

The samples chosen by modified selector 380 for the first plurality of samples (i.e., the full-interval samples) are those samples from previous cycles which are closest to being in the same phase as the current input sample. In other words, the samples of the first plurality of samples, $S_i$, are chosen from those memory cells 230" which store samples lying closest to the multiples of the tunable period, $P_t$, and which are identified according to the following equation:

$$S_i = X_{\text{ROUND}[P_t \cdot (i-1)]}$$

In addition, modified selector 380 also selects a second plurality of samples from a second plurality of memory cells 230" and outputs the samples to second adder 390. The number of memory cells 230" from which the second plurality of samples are chosen is the same as the number of memory cells 230" from which the first plurality of samples are chosen. Samples chosen by the modified selector 380 for the second plurality of samples are those samples from previous cycles of the digital composite input signal 235" which are closest to being midway in time between the samples of the first plurality of samples. In other words, the samples chosen for the second plurality of samples, $S_{i+\frac{1}{2}}$, (i.e., the half-interval samples) are those stored in memory cells 230" and identified according to the following equation:

$$S_{i+\frac{1}{2}} = X_{\text{ROUND}[P_t \cdot (i-\frac{1}{2})]}$$

In total, twice as many samples are chosen in the third preferred embodiment of the present invention as were chosen in the first and second preferred embodiments of the present invention, according to the following equation for the total number of samples, m:

$$m = 2^*k = 2^*[\text{ROUND}[(n/P_t)+1]]$$

Samples of the first plurality of samples, $S_i$, are combined (i.e., interfered) by first adder 385 to produce first intermediate resultants (i.e., defining a first intermediate signal) which are output on data line 420 to the first input of third adder 400. The second plurality of samples (i.e., the half-interval samples), $S_{i+\frac{1}{2}}$, are combined (i.e., interfered) by second adder 390 to produce second intermediate resultants (i.e., defining a second intermediate signal) which are output on data line 425 to inverter 395. The inverter 395 inverts the second intermediate resultants and outputs inverted second intermediate resultants on data line 430 to a second input of third adder 400. Upon combination of the first and second intermediate resultants by the third adder 400 to produce a third plurality of intermediate resultants defining third intermediate digital signal on data line 245", attenuator 225" divides the intermediate resultants of the third plurality of intermediate resultants by the total number of samples, m, to produce digital output signal 250" on data line 210".

Note that an aperiodic signal(s) is diminished through destructive interference in the first and second adders 385", 390" and is further diminished by division in attenuator 225". Use of half-interval samples in addition to full-interval samples further increases the signal-to-noise ratio of the filter's digital output signal 250" by a factor of two and also improves the rejection of low frequency noise.

Figure 7:
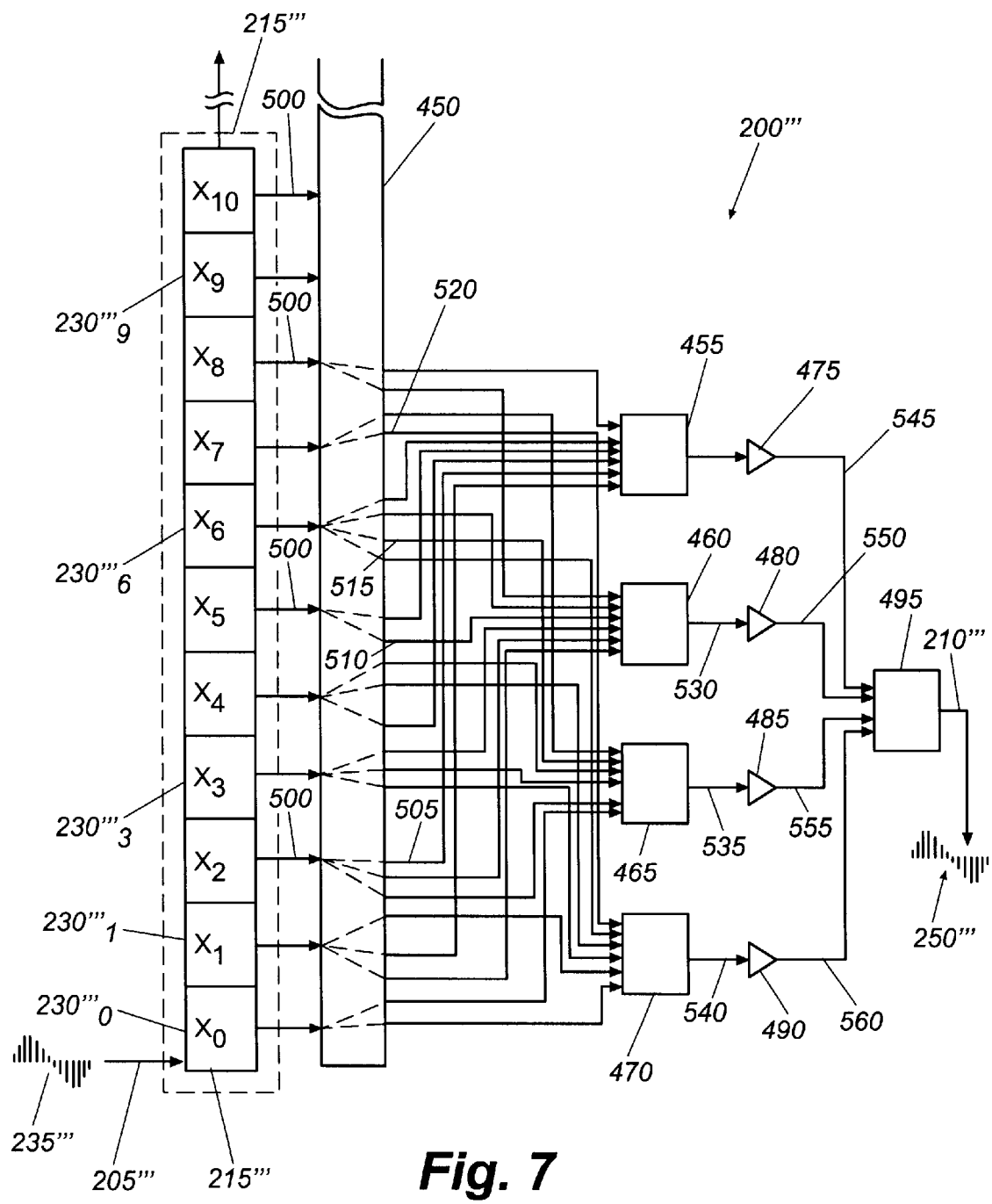
FIG. 7 displays a block diagram representation of a phase coherence filter in accordance with a fourth preferred embodiment of the present invention.

In accordance with an apparatus of a fourth preferred embodiment of the present invention, FIG. 7 displays a phase coherence filter 200''' comprising a memory 215''', a modified selector 450, a plurality of adders 455, 460, 465, 470, a plurality of attenuators 475, 480, 485, 490, and a sequencer 495. Memory 215''' includes a plurality of memory cells 230''' and is substantially similar to the memories 215, 215', 215" of the embodiments described above. Memory 215''' connects to a modified selector 450 through data lines 500. The modified selector 450 connects to the input ports of adders 455, 460, 465, 470 via respective data lines 505, 510, 515, 520. The outputs of adders 455, 460, 465, 470 connect through respective data lines 525, 530, 535, 540 to the input ports of respective attenuators 475, 480, 485, 490. Data lines 545, 550, 555, 560 connect respective attenuators 475, 480, 485, 490 to the input ports of sequencer 495. The sequencer's output port connects to data line 210''' which communicates the filter's output signal 250''' to destination devices.

According to a method of the fourth preferred embodiment of the present invention, the phase coherence filter 200''' sequentially receives samples of a composite input signal 235''' and stores the samples in memory cells 230''' in a manner substantially similar to that of the methods described above. The composite input signal 235''' includes samples having a tunable period, $P_t$, (i.e., the number of samples taken per cycle) that is not an integer and not a low denominator fraction. Use of such a tunable period ensures that the analog composite input signal 255''' represented by digital composite input signal 235''' has been sampled at numerous phase angles over successive cycles.

The modified selector 450 employs a four-times re-sampling rate to select pluralities of samples from memory 215''' via data lines 500. It is obvious to one reasonably skilled in the art that other re-sampling rates are employable. Each plurality of samples corresponds to one of four output samples, $Y_{i+0.00}$, $Y_{i+0.25}$, $Y_{i+0.50}$ and $Y_{i+0.75}$, which are produced for each input sample $X_i$ (i.e., output signal 250''', even though not visible in FIG. 7, includes four times as many data samples per cycle than the number of data samples of composite input signal 235'''). The number of memory cells 230''' chosen for each plurality, k, is related to the total number of memory cells 230''', n, according to the following equation:

$$k = \text{ROUND}[(n/P_t) + 1]$$

The samples chosen by modified selector 450 in each selected plurality of samples are those samples from previous cycles which are closest to being in the same phase as the present input sample, $X_i$, plus an adjustment coefficient j. In other words, the samples, $S_{i+j}$, which are chosen are the samples present in those memory cells 230''' which lie closest to the multiples of the tunable period, $P_t$, plus the adjustment coefficient, j, and are identified according to the following equation:

$$S_{i+j} = X_{ROUND[P_t \cdot (i-1)+j]}$$

The adjustment coefficient, j, defines the amount that the output sample which corresponds to that plurality of samples, $Y_{i+j}$, is to be delayed relative to the base samples, $X_i$. The extra samples produced by this process are evenly spaced relative to the base sample, $X_i$, and, hence, the extra samples in the four-times re-sampling phase coherence filter 200''' use the adjustment coefficients, j, of 0.00, 0.25, 0.50 and 0.75. Assuming that the phase coherence filter 200''' tunes to an appropriate value of 1.4 for the tunable period, $P_t$, the three members of the four pluralities of samples produced for each input sample are:

$$S_{1+0.00} = S_{1.00} = X_{ROUND[1.4 \cdot (1-1)+0.00]} = X_{ROUND[0.00]} = X_0$$

$$S_{1+0.25} = S_{1.25} = X_{ROUND[1.4 \cdot (1-1)+0.25]} = X_{ROUND[0.25]} = X_0$$

$$S_{1+0.50} = S_{1.50} = X_{ROUND[1.4 \cdot (1-1)+0.50]} = X_{ROUND[0.50]} = X_1$$

$$S_{1+0.75} = S_{1.75} = X_{ROUND[1.4 \cdot (1-1)+0.75]} = X_{ROUND[0.75]} = X_1$$

$$S_{2+0.00} = S_{2.00} = X_{ROUND[1.4 \cdot (2-1)+0.00]} = X_{ROUND[1.4]} = X_1$$

$$S_{2+0.25} = S_{2.25} = X_{ROUND[1.4 \cdot (2-1)+0.25]} = X_{ROUND[1.65]} = X_2$$

$$S_{2+0.50} = S_{2.50} = X_{ROUND[1.4 \cdot (2-1)+0.50]} = X_{ROUND[1.90]} = X_2$$

$$S_{2+0.75} = S_{2.75} = X_{ROUND[1.4 \cdot (2-1)+0.75]} = X_{ROUND[2.15]} = X_2$$

$$S_{3+0.00} = S_{3.00} = X_{ROUND[1.4 \cdot (3-1)+0.00]} = X_{ROUND[2.8]} = X_3$$

$$S_{3+0.25} = S_{3.25} = X_{ROUND[1.4 \cdot (3-1)+0.25]} = X_{ROUND[3.05]} = X_3$$

$$S_{3+0.50} = S_{3.50} = X_{ROUND[1.4 \cdot (3-1)+0.50]} = X_{ROUND[3.30]} = X_3$$

$$S_{3+0.75} = S_{3.75} = X_{ROUND[1.4 \cdot (3-1)+0.75]} = X_{ROUND[3.55]} = X_4$$

The modified selector 450 outputs the four j-specific pluralities of chosen samples (i.e., a first plurality including $X_0$, $X_1$, $X_3$, $X_4$, $X_6$...; a second plurality including $X_0$, $X_2$, $X_3$, $X_4$, $X_6$...; a third plurality including X, $X_2$, $X_3$, $X_5$, $X_6$...; and a fourth plurality including $X_1$, $X_2$, $X_4$, $X_5$, $X_6$...) to respective j-specific adders 455, 460, 465, 470 via respective data lines 505, 510, 515, 520.

The first adder 455 combines (and interferes) the first plurality of samples to produce an intermediate resultant (i.e., as described above) which is output to first attenuator 475 via data line 525. The first attenuator 475 divides the received intermediate resultant by the number of samples chosen for each plurality of samples, k, to produce output sample $Y_{i+0.00}$ having an amplitude which at least substantially matches the amplitude of the periodic component of composite input signal 235''' at the appropriate phase angle. Similarly, adders 460, 465, 470 respectively combine (and interfere) the second, third, and fourth pluralities of samples to produce respective intermediate resultants which are respectively output to the second, third, and fourth attenuators 480, 485, 490 via data lines 530, 535, 540. Attenuators 480, 485, 490 similarly average the respective intermediate resultants from adders 460, 465, 470 to produce respective output samples $Y_{i+0.25}$, $Y_{i+0.50}$, $Y_{i+0.75}$ having amplitudes which at least substantially match the respective amplitudes of composite input signal 235'''. Data lines 545, 550, 555, 560 communicate the output samples to sequencer 495.

Sequencer 495 produces digital output signal 250''' having a sampling rate of four times the sampling rate of input signal, $X_i$, by funneling $Y_{i+0.00}$, $Y_{i+0.25}$, $Y_{i+0.50}$ and $Y_{i+0.75}$ to phase coherence filter output data line 210''' in the proper order. Digital output signal 250''' has a signal-to-noise ratio that is improved over that of the composite input signal 235''' by a factor of $k*(1-e^{-(Pt-1)})$. Under certain circumstances, the digital output signal 250''' exceeds the limits of Nyquist's Theorem, allowing practical resolution of waveforms having tunable periods as small as 1.1. Note that while FIG. 7 depicts a parallel process for clarity, in practice a single modified selector (not shown), a single adder (not shown), and a single attenuator (not shown) process data in a series fashion.

Figure 8:
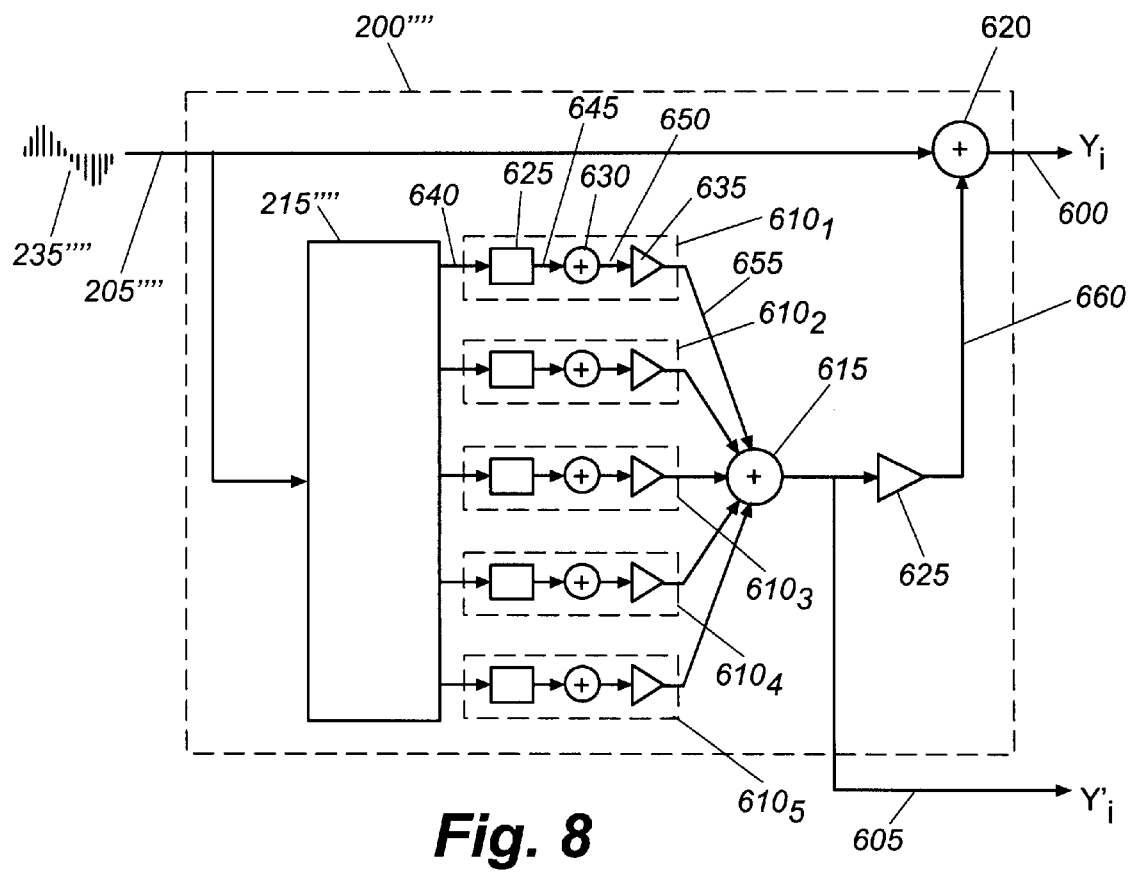
FIG. 8 displays a block diagram representation of a phase coherence filter in accordance with a fifth preferred embodiment of the present invention.

In accordance with an apparatus of a fifth preferred embodiment of the present invention, a phase coherence filter 200'''' having input data line 205'''', first output data line 600, and second output data line 600 is seen in FIG. 8. The phase coherence filter 200'''' comprises a memory 215'''' having a plurality of memory cells 230'''' substantially similar to the memories 215, 215', 215'', 215''' of the above-described preferred embodiments. The phase coherence filter 200'''' further comprises a plurality of parallel phase coherence filter units 610, first and second adders 615, 620, and an inverter 665. Input data line 205'''' connects to memory 215'''' and to second adder 620, and conveys digital samples of digital composite input signal 235'''' to the memory 215'''' and to second adder 620. First output data line 600 connects to the output port of second adder 620 and the second output data line 605 connects to the output port of first adder 615.

Each parallel phase coherence filter unit 610 of the plurality of parallel phase coherence filter units 610 is substantially similar to the other parallel phase coherence filter units 610 of the plurality of parallel phase coherence filter units 610. Each parallel phase coherence filter unit 610 includes a selector 625, an adder 630, and an attenuator 635. The selector 625 of each parallel phase coherence filter unit 610 connects to memory 215"" via data lines 640 and to the filter unit's adder 630 via data lines 645. The attenuator 635 connects, through data lines 650, to the filter unit's adder 630 and, through data lines 655, to the first adder 615 of the phase coherence filter 200"". The output port of the first adder 615 connects to the input port of inverter 665 via second output data line 605. The output port of the inverter 665 connects to an input port of second adder 620 through data line 660. In an alternate embodiment, the plurality of parallel phase coherence filter units 610 is replaced by a single phase coherence filter that processes data in a series method.

According to a method of the fifth preferred embodiment of the present invention, the phase coherence filter 200"" sequentially receives samples of digital composite input signal 235"" on input data line 205"" and loads each sample, $X_i$, into the memory cells 230"" of memory 215"" in the substantially the same manner as that described above for the other preferred embodiments. Next, each selector 625 of each parallel phase coherence filter unit 610 selects a plurality of samples from a plurality of memory cells 230"" of memory 215"" through data lines 640 and outputs the plurality of samples to the filter unit's adder 630 using data lines 645. Each selector 625 of each parallel phase coherence filter unit 610 is tuned to a different value of the tunable period, $P_t$, to enhance a different periodic waveform component of the digital composite input signal 235"", so each selector 625 chooses a different plurality of samples from a different plurality of memory cells 230"". The adder 630 of each of the filter units 610 combines (i.e., interferes) the samples selected by the filter unit's selector 625 to produce intermediate resultants on data lines 650. Upon receiving the intermediate resultants on data lines 650, the filter unit's attenuator 635 divides the intermediate resultants by the number of samples communicated by selector 625 to produce intermediate resultants having amplitudes at least substantially equivalent to the periodic portion of a new input data sample.

The plurality of parallel intermediate resultants produced by the parallel filter units 610 define parallel intermediate signals (also referred to as "parallel periodics") each having a periodic waveform with a reduced amount of aperiodic noise. First adder 615 combines the parallel intermediate resultants (and, hence, the parallel intermediate signals) of the plurality of parallel phase coherence filter units 610 to generate a secondary digital output signal (i.e., including secondary digital output samples, $Y_i'$) having the strongest periodics on second output data line 605. Then, inverter 665 inverts the secondary digital output signal on second output data line 605 to produce an inverted secondary digital output signal (i.e., including inverted digital secondary output samples of digital secondary output samples, $Y_i'$) on data lines 660 which the second adder 620 combines with composite input signal 235"" (i.e., with input samples of digital composite input signal 235"") to remove the filtered periodics from the composite input signal 235"" utilizing anti-phase cancellation and to produce a primary digital output signal (i.e., including digital primary output samples, $Y_i$) on first output data line 600. By removing the filtered periodics, the phase coherence filter 200"" produces a primary digital output signal which includes the generally aperiodic portion of the digital composite input signal 235"".

Figure 9:
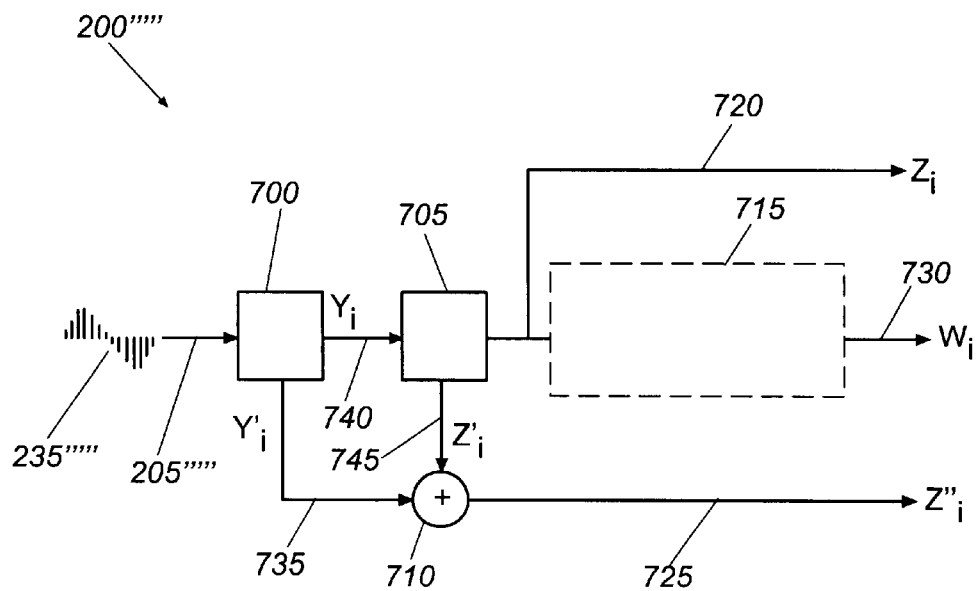
FIG. 9 displays a block diagram representation of a phase coherence filter in accordance with a sixth preferred embodiment of the present invention.

FIG. 9 displays a block diagram representation of a phase coherence filter 200""' according to a sixth preferred embodiment of the present invention. The phase coherence filter 200""' comprises first and second sub-processors 700, 705 which are substantially similar to phase coherence filter 200"" of the fifth preferred embodiment of the present invention and which connect together in a cascade arrangement. The phase coherence filter 200""' further comprises an adder 710 and a third sub-processor 715 which is substantially similar to the phase coherence filter 200 of the first preferred embodiment. The phase coherence filter 200""' has input data line 205""', and first, second, and third output data lines 720, 725, 730, respectively.

Input data line 205""' connects sub-processor 700 to a source of a digital composite input signal 235""'. Data line 735 connects the first output port of the first sub-processor 700 to a first input port of adder 710 and data line 740 connects the second output port of the first sub-processor 700 to the memory of the second sub-processor 705. The second output port of the second sub-processor 705 connects, via data line 745, to a second input port of adder 710. The output port of the second adder of second sub-processor 705 connects to the memory of the third sub-processor 715.

In accordance with a method of the sixth preferred embodiment of the present invention, the first sub-processor 700 sequentially and continually receives a plurality of samples of digital composite input signal 235""'. The samples are processed by the first sub-processor 700 according to a method which is substantially similar to the operation of phase coherence filter 200"" of the fifth preferred embodiment of the present invention described above. The first sub-processor 700 produces a digital primary output signal (i.e., including digital primary output samples, $Y_i$), on data lines 740, from which strong periodic signals have been removed and produces a digital secondary output signal (i.e., including digital secondary output samples, $Y_i'$), on data lines 735, which is generally periodic-rich. Because the first sub-processor 700 diverts the strongest periodics to the secondary output signal, the primary output signal is processable by a second stage including second sub-processor 705. The second sub-processor 705 separates out a second, weaker group of periodics that were previously masked by the stronger periodics separated by the first sub-processor 700. The operation of the second sub-processor 705 is substantially similar to that of the first sub-processor 700.

Adder 710 combines the secondary output signals (i.e., including digital secondary output samples $Y_i'$ and $Z_i'$) extracted by sub-processors 700, 705 and present on data lines 735, 745 to produce a periodic-rich, digital secondary output signal (i.e., including digital secondary output samples $Z_i''$) for phase coherence filter 200""' on second output data line 725. The primary output signal (i.e., including digital primary samples, $Z_i$) of second sub-processor 705 is a periodic-poor signal output from the phase coherence filter 200""' on first output data line 720 (i.e., which is of interest when the desired phase coherence filter output is the aperiodic portion of the digital composite input signal 235""') Because first output data line 720 connects to third sub-processor 715 and, hence, the primary output signal is input to the third sub-processor 715, a particular periodic signal which was so weak that it was hidden by the stronger periodics previously filtered out by sub-processors 700, 705 is enhanced using sub-processor 715 to produce a digital tertiary output signal (i.e., including digital tertiary samples, $W_i$) on third output line 730. The tertiary output signal includes a weak periodic waveform that was originally obscured within digital composite input signal 235''''' by strong, competing periodics and noise.

In alternate embodiments of the present invention, phase coherence filters 200 of any of the preferred embodiments described above further comprise: an analog-to-digital converter having an input port which connects to an analog signal source element and an output port which connects to the memory of the phase coherence filter 200; and, a digital-to-analog converter having an input port which connects to an output port of the phase coherence filter 200 and an output port which connects to an analog signal destination device. In operation, the analog-to-digital converter converts an analog composite input signal 255 into a digital composite input signal 235, including a plurality of samples each having a potentially different amplitude, which is representative of the analog composite input signal 255. The memory of the phase coherence filter 200 stores the samples as described herein. Preferably, the analog-to-digital converter samples the analog composite input signal 255 at a sampling rate of between 4 and 20 samples per period of the periodic signal of the analog composite input signal 255. The digital-to-analog converter converts a digital output signal 250, including a plurality of samples each having a potentially different amplitude, into an analog output signal 310 for use in an analog domain.

In other alternate embodiments of the present invention, it is advantageous to attenuate the sample data with time. One means of attenuation would be to drop the least significant bit on the even hundred registers of a memory (i.e., this assumes that the memory is a shift register memory). Alternatively, the memory might store unattenuated data, but the selector may attenuate older samples before directing the data to the adder. Sample attenuation results in a slightly lower signal-to-noise increase, but requires less memory and improves automatic tuning performance. Sample attenuation also slightly improves the tracking performance of a highly modulated signal.

In an analog alternate embodiment of the present invention, a phase coherence filter comprises an input waveguide and a reflective chamber having a cavity with a length measuring in excess of its width. The reflective chamber is configured to support a standing wave and includes, within the cavity, a reflector which is movable to enable adjustment of the chamber's resonant frequency. The phase coherence filter also includes a coarse positioner and a fine positioner to alter the position of the reflector within the cavity. A coarse positioner, acceptable according to the alternate embodiment, is a screw drive. A fine positioner, acceptable according to the alternate embodiment, is a piezoelectric element. The phase coherence filter further includes an output waveguide coupled to the reflective chamber.

In operation, the phase coherence filter of the analog alternate embodiment receives a composite input signal having a periodic signal and an aperiodic signal. The input waveguide directs the composite input signal into the reflective chamber and toward the movable reflector. By positioning the movable reflector so that the effective length of the reflective chamber is exactly one-half of the wavelength of a desired output signal, many cycles of the composite input signal are reflected within the cavity between the input end of the reflective chamber and the movable reflector. The reflected cycles of the periodic signal constructively interfere, while the reflected aperiodic signal destructively interferes with itself to produce an output signal having an amplified periodic signal and an attenuated aperiodic signal. The output waveguide directs the filter's output signal to a receiver or, perhaps, a transducer.

Whereas this invention has been described in detail with particular reference to its preferred and/or alternate embodiments, it is understood that variations and modifications can be effected within the spirit and scope of the invention, as described herein before and as defined in the appended claims. The corresponding structures, materials, acts, and equivalents of all means or step plus function elements, if any, in the claims below are intended to include any structure, material, or acts for performing the functions in combination with other claimed elements as specifically claimed.

What is claimed is:

1. An apparatus for increasing the signal-to-noise ratio of an input signal, said apparatus comprising:

a memory connectable to a source of a plurality of digital data samples of a composite input signal having periodic and aperiodic portions, wherein each digital data sample of said plurality of digital data samples includes periodic and aperiodic portions and represents the amplitude of the composite input signal taken at a different time, and wherein said memory is operative to receive and store said plurality of digital data samples;

an adder communicatively connected to said memory, said adder being operative to receive a plurality of appropriate digital data samples of said plurality of digital data samples from said memory and to cause destructive interference of the aperiodic portions of said appropriate digital data samples of said plurality of appropriate digital data samples, said adder being further operative to cause constructive interference of the periodic portions of said appropriate digital data samples of said plurality of appropriate digital data samples, wherein said appropriate digital data samples of said plurality of appropriate digital data samples are those digital data samples of said plurality of digital data samples taken at substantially the same time relative to the start of different cycles of the periodic portion of the composite input signal; and, an attenuator communicatively connected to said adder, said attenuator being operative to receive from said adder an intermediate signal representative of the destructive interference of the aperiodic portions of said appropriate digital data samples and to produce an output signal having a periodic portion and an aperiodic portion, wherein the ratio of the periodic portion to the aperiodic portion of the output signal is generally larger than the ratio of the periodic portion to the aperiodic portion of the composite input signal at a particular phase angle of the periodic portion of the composite input signal.

2. The apparatus of claim 1, wherein said output signal includes a plurality of digital data samples having a respective plurality of amplitudes, and wherein said attenuator is operative to at least substantially match the amplitudes of said plurality of digital data samples of said output signal to the amplitudes of the periodic portions of respective digital data samples of said plurality of digital data samples of said composite input signal taken at substantially the same time relative to the start of a cycle of the periodic portion of the composite input signal.

3. The apparatus of claim 1, wherein said apparatus further comprises a selector communicatively connected between said memory and said adder, wherein said selector is operative to select a plurality of appropriate digital data samples of said plurality of digital data samples from said memory which are substantially in phase, and wherein said selector is operative to communicate said plurality of appropriate digital data samples to said adder.

4. The apparatus of claim 1, wherein said memory is organized as a plurality of sequentially ordered memory cells including a number of sequentially ordered memory cells sufficient to store digital data samples corresponding to at least one cycle of the composite input signal, and wherein a digital data sample of said plurality of digital data samples is shiftable from a first memory cell of said plurality of sequentially ordered memory cells to the next sequentially ordered memory cell of said plurality of sequentially ordered memory cells in order to receive a new digital data sample from said source.

5. An apparatus for increasing the signal-to-noise ratio of an input signal, said apparatus comprising:

an adder connected to a source of a composite input signal including a periodic signal and a noise signal, said adder being operative to receive said composite input signal at a first time and at a second time, said adder being further operative to interfere said composite input signal received at said first time with said composite input signal received at said second time and to produce a resultant signal representative of the interference of said composite input signal received at said first and second times, wherein said periodic signal of said composite signal at said first time is substantially in phase with said periodic signal of said composite signal at said second time.

6. The apparatus of claim 5, wherein said apparatus further includes an attenuator connected to said adder, said attenuator being operative to receive said resultant signal from said adder and to produce an output signal having a desired amplitude through attenuation of said resultant signal.

7. The apparatus of claim 6, wherein said composite input signal has a first amplitude at said first time and has a second amplitude at said second time, and wherein said desired amplitude of said output signal represents an average of said first and second amplitudes of said composite input signal.

8. The apparatus of claim 5, wherein said noise signal includes an aperiodic signal.

9. The apparatus of claim 5, wherein said resultant signal includes a first portion and a second portion, said first portion of said resultant signal being representative of constructive interference of said periodic signal received at said first and second times, and said second portion of said resultant signal being representative of destructive interference of said noise signal received at said first and second times.

10. The apparatus of claim 5, wherein said apparatus further includes a storage device connected between said adder and said source of said composite input signal, said storage device being operative to store said composite input signal at said first and second times.

11. The apparatus of claim 5, wherein said adder is further operative to receive said composite input signal at a plurality of times, said first and second times being particular times of said plurality of times, wherein said adder is further operative to interfere said composite input signal received at said first time of said plurality of times with said composite input signal received at multiple other times of said plurality of times and to produce a resultant signal representative of the interference of said composite input signal received at said first time and at said multiple other times, and wherein said periodic signal of said composite input signal at said first time is substantially in phase with said periodic signal of said composite input signal at said multiple other times.

12. The apparatus of claim 11, wherein said plurality of times includes a first plurality of times at which said periodic signal of said composite input signal is offset by a first offset time relative to the start of a cycle of said periodic signal, wherein said plurality of times further includes a second plurality of times at which said periodic signal of said composite input signal is offset by a second offset time relative to the start of a cycle of said periodic signal, wherein said adder is further operative to interfere said composite input signal at said first plurality of times to produce a first resultant signal representative of the interference of said composite input signal at said first plurality of times, wherein said adder is further operative to interfere said composite input signal at said second plurality of times to produce a second resultant signal representative of the interference of said composite input signal at said second plurality of times.

13. The apparatus of claim 11, wherein said apparatus further includes a selector connected to said adder, said selector being operative to identify said multiple other times from said plurality of times at which said composite input signal is to be interfered with said composite input signal received at said first time.

14. A method of increasing the signal-to-noise ratio of an input signal, said method comprising the steps of:

receiving a first sample of a composite input signal including a periodic signal and a noise signal taken at a first time, wherein the first sample includes a periodic portion and a noise portion;

receiving a second sample of the composite input signal taken at a second time, wherein the second sample includes a periodic portion and a noise portion;

constructively interfering the periodic portion of the first sample and the periodic portion of the second sample;

destructively interfering the noise portion of the first sample and the noise portion of the second sample; and, generating a sample of an output signal representative of the constructive interference of the periodic portions of the first and second samples and the destructive interference of the noise portions of the first and second samples;

wherein the periodic signal has a period and said first and second times are substantially separated in time by the period of the periodic signal.

15. The method of claim 14, wherein the periodic portions of the first and second samples have respective amplitudes, wherein the sample of the output signal has an amplitude, and the method further comprises a step of adjusting the amplitude of the sample of the output signal to at least substantially match the amplitude of a periodic portion of one of the first and second samples.

16. The method of claim 14, wherein the noise signal includes an aperiodic signal.

17. The method of claim 14, wherein the method further comprises the steps of storing in a storage device the first sample and retrieving from the storage device the first sample prior to the step of constructively interfering the periodic portions of the first and second samples.

18. The method of claim 14, wherein the method further comprises the steps of: receiving a plurality of additional samples of the composite input signal taken at a respective plurality of additional times; storing in a storage device the first sample, the second sample, and the plurality of additional samples; and, selecting additional samples of the composite input signal from the plurality of additional samples stored in the storage device; and, performing the steps of constructively interfering, destructively interfering, and generating using the first, second, and selected additional samples of the composite input signal.

19. The method of claim 18, wherein the step of selecting includes selecting, from the plurality of additional samples, respective additional samples of the composite input signal taken during respective different cycles of the periodic signal at respective times substantially separated in time by the period of the periodic signal.

* * * * *